(12) United States Patent
Kobayashi

(10) Patent No.: US 7,223,147 B2
(45) Date of Patent: May 29, 2007

(54) METHOD OF PRODUCING ELECTROLUMINESCENCE APPARATUS, ELECTROLUMINESCENCE APPARATUS AND ELECTRONIC DEVICE

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 127 days.

(21) Appl. No.: 10/693,957

(22) Filed: Oct. 28, 2003

(65) Prior Publication Data

US 2004/0119406 A1    Jun. 24, 2004

(30) Foreign Application Priority Data

Oct. 31, 2002   (JP)   ............................. 2002-317566
Sep. 22, 2003   (JP)   ............................. 2003-330212

(51) Int. Cl.
*H01J 9/00*   (2006.01)
*H01J 2/24*   (2006.01)

(52) U.S. Cl. .......................................... 445/24; 445/25

(58) Field of Classification Search .................. 445/24, 445/25; 313/504, 506; 427/66; 428/690
See application file for complete search history.

(56) References Cited

U.S. PATENT DOCUMENTS

| | | | | |
|---|---|---|---|---|
| 6,461,899 | B1 * | 10/2002 | Kitakado et al. | 438/149 |
| 6,469,438 | B2 * | 10/2002 | Fukuoka et al. | 313/504 |
| 6,558,817 | B1 | 5/2003 | Ueda et al. | 428/690 |
| 6,821,649 | B2 * | 11/2004 | Kambe et al. | 428/690 |
| 2002/0093283 | A1 | 7/2002 | Satoshi et al. | |

FOREIGN PATENT DOCUMENTS

| | | |
|---|---|---|
| JP | 11-040369 A | 2/1999 |
| JP | A 11-233262 | 8/1999 |
| JP | 2000-091078 A | 3/2000 |
| JP | 2000-182782 | 6/2000 |
| JP | A 2000-182774 | 6/2000 |
| JP | 2000-223277 A | 8/2000 |
| JP | 2001-160487 | 6/2001 |
| JP | A 2001-284055 | 10/2001 |
| JP | A-2002-289352 | 10/2002 |
| JP | A-2002-305077 | 10/2002 |
| JP | 2003-100455 | 4/2003 |
| JP | 2003-178876 A | 6/2003 |

* cited by examiner

Primary Examiner—Mariceli Santiago
Assistant Examiner—Kevin Quarterman
(74) Attorney, Agent, or Firm—Oliff & Berridge, PLC

(57) ABSTRACT

A method of producing an electroluminescence apparatus, an electroluminescence apparatus, and an electronic device having excellent light-emitting properties and light-emitting life are provided. A suitable electron injection layer can be formed using a liquid-phase method while a light-emitting layer is prevented from dissolution by a composition ink. Also provided are a method of producing an electroluminescence apparatus, an electroluminescence apparatus, and an electronic device in which formation of the electron injection layer can be simplified. The method of producing an electroluminescence apparatus having a plurality of light-emitting layers that emit light with different colors can include the step of forming an electron injection layer by a liquid discharge method or a printing method when predetermined types of the light-emitting layers are formed. A material for forming the electron injection layer can be a liquid material containing an organic metal compound.

6 Claims, 5 Drawing Sheets

METHOD OF PRODUCING ELECTROLUMINESCENCE APPARATUS, ELECTROLUMINESCENCE APPARATUS AND ELECTRONIC DEVICE

BACKGROUND OF THE INVENTION

1. Field of Invention

The present invention relates to a method of producing an electroluminescence device, an electroluminescence apparatus and an electronic device.

2. Description of Related Art

A typical light-emitting apparatus including a light-emitting layer is an electroluminescence apparatus having organic electroluminescence elements utilizing an organic semiconductor as a light-emitting layer. Generally, an organic functional layer containing the light-emitting layer can be disposed between a pair of electrodes facing each other. The electroluminescence apparatus for a color display has a plurality of light-emitting layers that have light-emitting wavelength bands corresponding to red (R), green (G) and blue (B), respectively. The light-emitting layers corresponding to respective colors are disposed on a substrate in a predetermined arrangement.

In the electroluminescence apparatus, an electron injection layer may be formed to promote electron injection from an electrode to the light-emitting layer, in order to improve light-emitting properties such as intensity, light-emitting efficiencies and the like. The electron injection layer is generally formed by a vapor deposition method. For example, see Japanese Unexamined Patent Application Publication No. 2001-160487 and Japanese Unexamined Patent Application Publication No. 2000-182782.

SUMMARY OF THE INVENTION

When the electron injection layer is disposed on all light-emitting layers in a same manner, light-emitting properties may be superior or inferior depending on the types of the light-emitting layers. Therefore, the electron injection layer is disposed only on a predetermined light-emitting layer. For example, the electron injection layer having LiF is disposed specifically on the blue (B) light-emitting layer among the red (R), green (G) and blue (B) light-emitting layers. The electron injection layer is formed only on the required light-emitting layer by a mask deposition method. In the mask deposition method, not only a mask is required to specify deposition parts, but also the mask has to be aligned with the substrate with high precision. If a number of deposition parts are disposed, it can be difficult to be aligned.

In recent years, an ink jet method (a liquid discharge method) has been proposed. In the method, a composition ink including predetermined materials dissolved in water is discharged to form predetermined patterns. However, when the electron injection layer comprising LiF is formed by using the ink jet method, the water in the composition ink undesirably remains on the light-emitting layer, resulting in a shortened light-emitting life. Also, LiF is unfavorably difficult to be dissolved in an aqueous solvent such as water. If LiF is replaced with NaF, NaF is crystallized on the surface of the light-emitting layer to provide an unsuitable electron injection layer. If a benzene-based solvent or a phenyl-based solvent is replaced with the aqueous solvent, the light-emitting layer is undesirably dissolved. In either case, there are no suitable materials or solvents for forming the electron emitting layer.

An object of the present invention is to provide a method of producing an electroluminescence apparatus, an electroluminescence apparatus, and an electronic device that can provide excellent light-emitting properties and light-emitting life. When the electron injection layer is formed using the liquid phase method, the suitable electron injection layer is formed while a light-emitting layer is prevented from being dissolved by the composition ink.

Another object of the present invention is to provide a method of producing an electroluminescence apparatus, an electroluminescence apparatus, and an electronic device in which the electron injection layer can be formed in a simple method to simplify the manufacturing processes.

In order to achieve the objects, the present invention can provide a method of producing an electroluminescence apparatus, including the steps of: forming a plurality of light-emitting layers that emit light with different colors, forming an electron injection layer containing an organic metal compound such that the electron injection layer is contacted with at least one of the plurality of the light-emitting layers, and forming a layer capable of reducing the metal in the organic metal compound such that the layer is contacted with the electron injection layer. According to the present invention, the electron injection layer containing the organic metal compound can be formed to prevent the dissolution of the light-emitting layer, as well as to provide excellent wettability on the surface of the light-emitting layer. Also, the electron injection layer formed on the light-emitting layer can be prevented from being crystallized.

According to the present invention, the layer capable of reducing the metal of the organic metal compound can be a cathode. The layer capable of reducing the metal of the organic metal compound may preferably include, for example, Mg, Ca, Al and the like. According to the present method, the metal in the organic metal compound is reduced to diffuse within the light-emitting layer. Atoms in the metal become integrated with organic semiconductor molecules in the light-emitting layer, resulting in high electron injection properties. When a current flows into an anode, anodic positive holes are injected into the light-emitting layer, and electrons are injected into the light-emitting layer through the electron injection layer. The positive holes are connected with the electrons, whereby the electroluminescence apparatus that well emits light can be produced.

According to the present invention, the electron injection layer can be formed by using a liquid material as a solvent containing any one of an alcohol, a ketone, an ether, an ester, and an amide. Specifically, each of the plurality of the light-emitting layers has compartments, and the electron injection layer may be formed by injecting the liquid material into the compartments. According to the present method, the organic metal compound is uniformly dissolved in the liquid materials to provide the composition ink having an uniform concentration. Thus, the liquid discharge method or the printing method can be easily performed.

Also, the electron injection layer formed on the light-emitting layer can be prevented from being crystallized. Such electroluminescence apparatus having the electron injection layer formed by using the liquid discharge method or the printing method can have similar light-emitting properties and light-emitting life as that formed by using the vapor deposition method. In particular, when the liquid is injected into the compartments using the liquid discharge method, less materials are used, and a desirable amount of the materials can be accurately disposed at the desired position. Also, the manufacturing processes can be simplified, whereby the electroluminescence apparatus can be manufactured with low costs. According to the present invention, the light-emitting layer can be prevented from being dissolved, the organic metal compound is preferably dissolved in the liquid materials. Excellent wettability can be provided on the light-emitting layer. Thus, the electron injection layer can be preferably formed.

In the method of producing the electroluminescence apparatus of the present invention, the organic metal compound can contain at least one metal element selected from group 1A of the periodic table, group 2A of the periodic table, and a rare earth element. Preferably, the metal element is selected from Li, Na, K, Rb, Cs, Mg, Ca, Sr, Ba, La, Ce, Pr, Nd, Pm, Sm, Eu, Gd, Tb, Dy, Ho, Er, Tm, Yb and Lu. The organic metal compound is an organic metal complex, such as lithium quinolinole, an organic substance to which a metal is bonded, i.e., phenyl lithium, a salt of an organic substance and a metal, i.e., lithium benzoate. The complex herein generally means that negative, neutral or positive monodentate ligands or polydentate ligands are coordinated to atoms or ions of the metal and metal-like elements so that the atoms or ions are centered. According to the present invention, the electron injection efficiency to the light-emitting layer can be improved.

The step of forming the plurality of light-emitting layers can also include the steps of forming a light-emitting layer that emits red light, forming a light-emitting layer that emits green light, and forming a light-emitting layer that emits blue light, and the electron injection layer containing the organic metal compound is formed such that the electron injection layer is at least contacted with the light-emitting layer that emits the blue light. According to the present invention, the electron injection layer is formed such that the layer is contacted with the blue light-emitting layer having relatively low light-emitting efficiency, whereby the light-emitting efficiencies of respective colors can be similar.

The electroluminescence apparatus of the present invention can include a plurality of light-emitting layers that emit light with different colors, an electron injection layer containing an organic metal compound such that the electron injection layer is contacted with at least one of the plurality of the light-emitting layers, and a layer capable of reducing the metal in the organic metal compound such that the layer is contacted with the electron injection layer. According to the present invention, the electron injection layer containing the organic metal compound is formed to prevent the dissolution of the light-emitting layer, as well as to provide excellent wettability on the surface of the light-emitting layer. Also, the electron injection layer formed on the light-emitting layer can be prevented from being crystallized.

According to the present invention, one of the light-emitting layers can be sandwiched between an anode and a cathode, and the layer capable of reducing the metal in the organic metal compound is the cathode. The layer capable of reducing the metal of the organic metal compound may include preferably a metal selected from the group consisting of Mg, Ca, Al and the like. According to the present invention, the metal in the organic metal compound is reduced to diffuse within the light-emitting layer. Atoms in the metal become integrated with organic semiconductor molecules in the light-emitting layer, resulting in high electron injection properties. When a current flows into an anode, anodic positive holes are injected into the light-emitting layer, and electrons are injected into the light-emitting layer through the electron injection layer. The positive holes are connected with the electrons, whereby the electroluminescence apparatus that well emits light can be produced.

According to the present invention, each of the plurality of the light-emitting layers has compartments, and the electron injection layer is formed by injecting the liquid material into the compartments. Even if the electron injection layer can be formed with the liquid materials, the electron injection layer can be formed at an accurate desired position, since the liquid materials cannot leak from the compartments.

The organic metal compound can contain at least one metal element selected from group 1A of the periodic table, group 2A of the periodic table, and a rare earth element. Specifically, the metal element is selected from Li, Na, K, Rb, Cs, Mg, Ca, Sr, Ba, La, Ce, Pr, Nd, Pm, Sm, Eu, Gd, Tb, Dy, Ho, Er, Tm, Yb and Lu. According to the present invention, the electron injection efficiency to the light-emitting layer can be improved.

The plurality of light-emitting layers may include a light-emitting layer that emits red light, a light-emitting layer that emits green light, and a light-emitting layer that emits blue light, and the electron injection layer containing the organic metal compound is disposed such that the electron injection layer is at least contacted with the light-emitting layer that emits the blue light, whereby the light-emitting efficiencies of respective colors can be well-balanced.

The electronic device of the present invention can include the electroluminescence apparatus described above as a display. Examples of the electronic device of the present invention include mobile phones, mobile information terminals, clocks, and information processing equipment such as word-processors and personal computers. The electroluminescence apparatus of the present invention can be used as the display of the electronic device, whereby the electronic device comprising the display with excellent light-emitting properties and light-emitting life can be produced with low cost. The electronic device can be manufactured by incorporating the electroluminescence apparatus of the present invention into the display of various electronic device including mobile phones, mobile information processing equipment, watch-shaped electronic devices.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Referring to Figures, the present invention will be described below. It is noted that scales of respective layers or respective members in the referenced Figures may be different in order that the layers or the members are recognizable.

Figure 1:
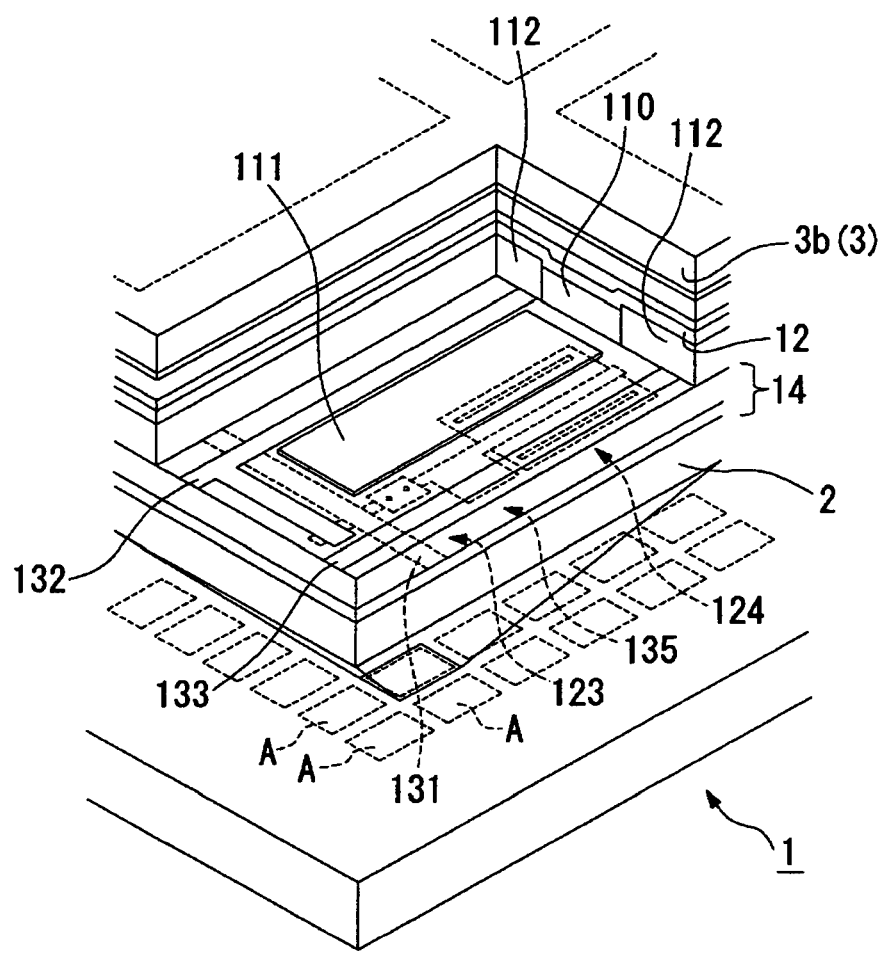
FIG. 1 shows a diagram schematically showing a structure of an electroluminescence apparatus according to the present invention.

FIG. 1 is a view schematically showing an embodiment of an electroluminescence apparatus of the present invention, especially an active matrix type electroluminescence apparatus. The electroluminescence apparatus 1 utilizes an active type driving method using a thin film transistor.

The electroluminescence apparatus 1 can include a substrate 2 on which a circuit element 14 including a thin film transistor as a circuit element, a pixel electrode (anode) 111, a functional layer 110 including a light-emitting layer (organic electroluminescence layer), a cathode 12 and a seal 3 are sequentially laminated.

In this embodiment, the substrate 2 is a glass substrate. In the present invention, besides a glass substrate, there can be used known various substrates for use in an electro-optic device or a circuit substrate, such as a silicon substrate, a quartz substrate, a ceramic substrate, a metal substrate, a plastic substrate and a plastic film substrate. A plurality of pixel areas A are arranged in a matrix on the substrate 2. For a color display, pixel areas A of respective colors red (R), green (G) and blue (B) are arranged in a predetermined array. In each pixel area A, a pixel electrode 111 is disposed. Adjacent to the pixel electrode 111, a signal line 132, a power supply line 133, a scanning line 131 and other scanning lines for other pixel electrodes (not shown) are disposed. As shown in FIG. 1, the pixel area A has a rectangle plane shape. The pixel area A may be circular or elliptic, or of any other shape.

The seal 3 is for preventing water or oxygen from entering to avoid oxidation of the cathode 12 or the functional layer 110. The seal 3 includes a sealing resin applied to the substrate 2, and a sealing substrate 3b (sealing can) adhered to the substrate 2 and the like. Examples of a sealing resin can include a thermosetting resin or an ultraviolet curing resin. An epoxy resin that is one of the thermosetting resin is especially preferable. The sealing resin is applied to a peripheral of the substrate by, for example, a micro dispenser or the like. The sealing substrate 3b is made of glass, metal or the like. The substrate 2 is adhered to the sealing substrate 3b via the sealing resin.

Figure 2:
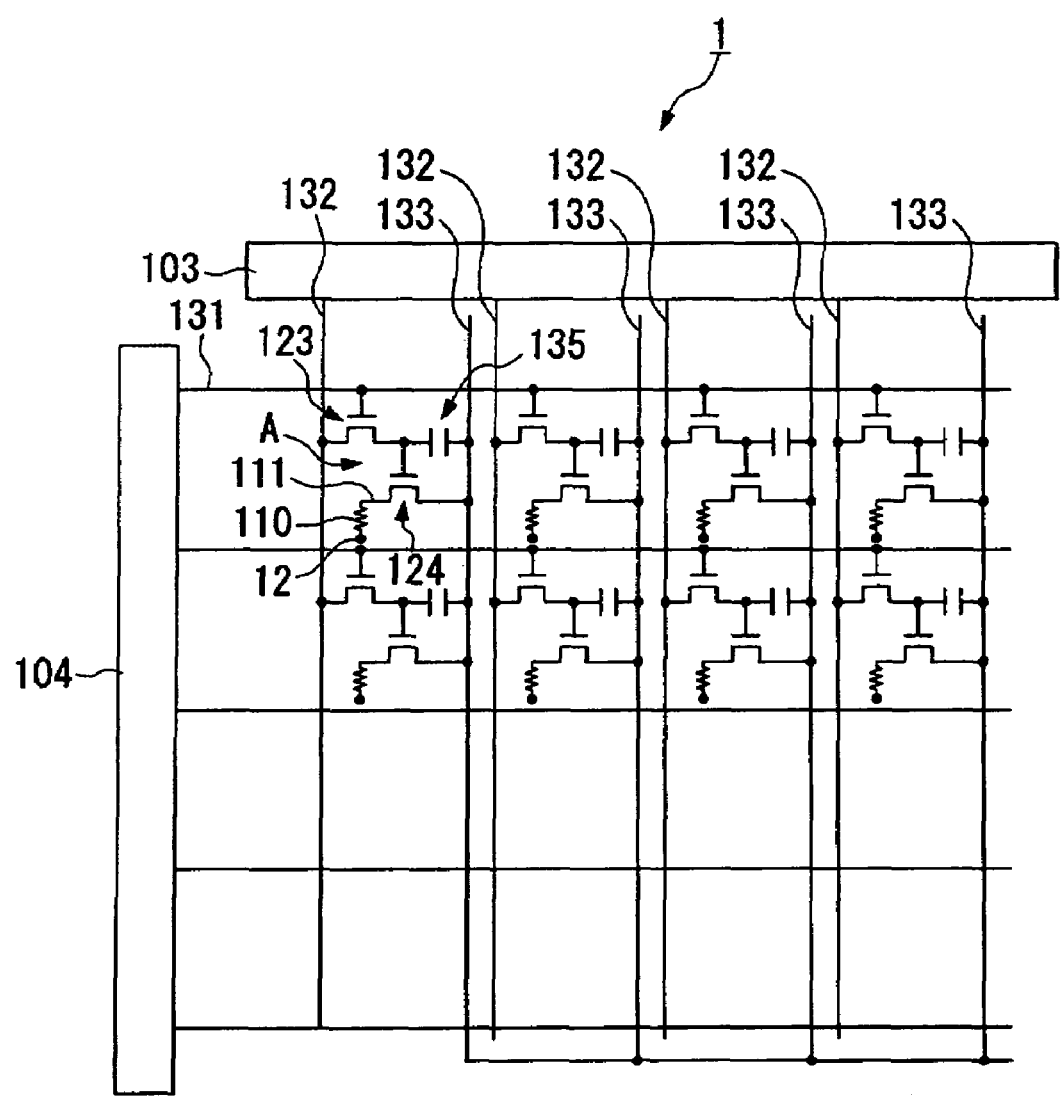
FIG. 2 shows a circuit diagram showing an active matrix type electroluminescence apparatus.

FIG. 2 shows an exemplary circuit of the electroluminescence apparatus 1. In FIG. 2, on the substrate 2, a plurality of the scanning lines 131, a plurality of the signal lines 132 that extend in cross-directions to the scanning lines 131, and a plurality of the power supply lines 133 that extend in parallel with the signal lines 132 are arranged. At each intersection point of the scanning lines 131 and the signal lines 132, the pixel area A is formed. A data driving circuit 103 including, for example, a shift resistor, a level shifter, a video line and an analogue switch is connected to the signal lines 132. A scanning driving circuit 104 including a shift resistor and a level shifter is connected to the signal lines 131.

On the pixel area A, a first thin film transistor 123 for switching that a scanning signal is provided to a gate electrode via a scanning line 131, a storage capacitor 135 for holding an image signal provided by the signal line 132 via the thin film transistor 123, a second thin film transistor 124 for driving that the image signal held by the storage capacitor 135 is provided to the gate electrode, a pixel electrode 111 (anode) into which a driving current flows from the power supply line 133 when the pixel electrode 111 is electrically connected to the power supply line 133 via the thin film transistor 124, and the functional layer 110 sandwiched between the pixel electrode 111 and a counter electrode 12 (cathode). The functional layer 110 can include an organic electroluminescence layer as the light-emitting layer.

On the pixel area A, when the scanning line 131 is driven to turn on the first thin film transistor 123, potential of the signal line 132 is held at the storage capacitor 135, and conductivity of the second thin film transistor 124 is determined depending on the status of the storage capacitor 135. A current flows from the power supply line 133 to the pixel electrode 111 via a channel of the second thin film transistor 124, and a current flows to the counter electrode 12 (cathode) through the functional layer 110. Depending of a current quantity, the functional layer 110 emits light.

Figure 3:
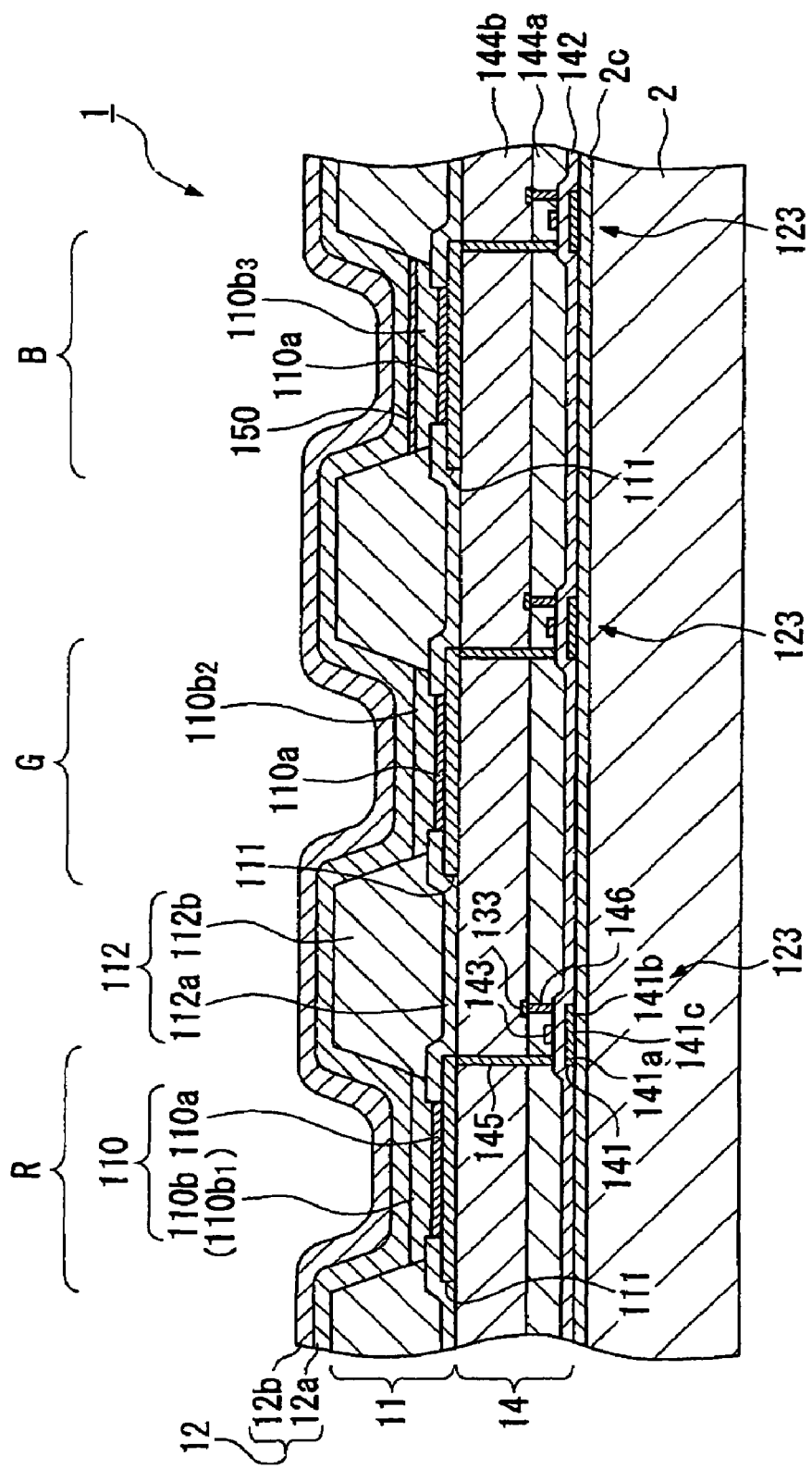
FIG. 3 shows an enlarged sectional view showing a display of an electroluminescence apparatus.

FIG. 3 is an enlarged sectional view showing a display in the electroluminescence apparatus 1. In FIG. 3, sectional views of three pixels in red (R), green (G) and blue (B) are shown. As described above, the electroluminescence apparatus 1 can include the substrate 2 on which a circuit element 14 including a circuit, such as the TFT, the pixel electrode (anode) 111, a light-emitting element 111 on which the functional layer 110 is formed, and the cathode 12 are sequentially laminated. In the electroluminescence apparatus 1, light emitted from the functional layer 110 to the substrate 2 is emitted to a bottom of the substrate 2 (viewer side) through the circuit element 14 and the substrate 2, and light emitted from the functional layer 110 to an opposite side of the substrate 2 is reflected by the cathode 12 and is emitted to the bottom of the substrate 2 (viewer side) through the circuit element 14 and the substrate 2.

A protective underlayer 2c having a silicon oxide film can be formed between the circuit element 14 and the substrate 2. On the protective underlayer 2c, an island-shaped semiconductor film 141 including polycrystalline silicon is formed. The semiconductor layer 141 has a source 141a and a drain 141b that are formed by enriched P ion implantation. A portion where P is not implanted is a channel 141c. The circuit element 14 further has a transparent gate insulation film 142 that covers the protective underlayer 2c and the semiconductor film 141. A gate electrode 143 (scanning line) comprising Al, Mo, Ta, Ti, W or the like is formed on the gate insulation film 142. A transparent first interlayer insulation film 144a and second interlayer insulation film 144b are formed on the gate electrode 143 and the gate insulation film 142. The gate electrode 143 is disposed at a position corresponding to the channel 141c of the semiconductor layer 141. Contact holes 145 and 146 that are respectively connected to the source 141a and drain 141b on the semiconductor film 141 are formed through the first and second interlayer insulation films 144a and 144b. Further, a transparent pixel electrode 111 comprising ITO or the like is patterned in a predetermined shape and formed on the second interlayer insulation film 144b. One contact hole 145 is connected to the pixel electrode 111. The other contact hole 146 is connected to the source supply line 133. Thus, a driving thin film transistor 123 that is connected to each pixel electrode 111 is formed on the circuit element 14. Also, the above-mentioned storage capacitor 135 and the switching thin film transistor 124 are formed on the circuit element 14, but are not shown in FIG. 3.

A light-emitting element 11 can include functional layers 110 that are laminated on the plurality of the pixel electrodes 111, and a bank 112 disposed between the functional layers 110 for partitioning the functional layers 110. The cathode 12 is disposed on the functional layer 110. The light-emitting layer which is the light-emitting element has the pixel electrode 111, the cathode 12, the functional layer 110 and the like. The pixel electrode 111 can include ITO, and is patterned in a nearly rectangle shape in the plan view. Preferably, the pixel electrode 111 has a thickness of 50 to 200 nm, and particularly about 150 nm.

The bank 112 is constituted by laminating an inorganic bank layer 112a (first bank layer) disposed on the substrate 2 and an organic bank layer 112b (second bank layer) disposed apart from the substrate 2, as shown in FIG. 3. The inorganic bank layer 112a includes an inorganic material, such as $SiO_2$, $TiO_2$ and the like. The organic bank layer 112b can include a heat resistant and solvent resistant resist, such as an acrylic resin and a polyamide resin.

The functional layer 110 may have a positive hole injection/transportation layer 110a laminated on the pixel electrode 111 and a light-emitting layer 110b formed adjacent to the positive hole injection/transportation layer 110a. The positive hole injection/transportation layer 110a has a function to inject the positive hole into the light-emitting layer 110b, and also has a function to transport the positive hole within the positive hole injection/transportation layer 110a. The positive hole injection/transportation layer 110a is disposed between the pixel electrode 111 and the light-emitting layer 110b, whereby the light-emitting layer 110b has improved light-emitting properties, such as light-emitting efficiency and life. In the light-emitting layer 110b, the positive hole injected from the positive hole injection/transportation layer 110a and electron injected from the cathode 12 are recombined to emit light.

The light-emitting layer 110b includes a red light-emitting layer $110b_1$ that emits red (R) light, a green light-emitting layer $110b_2$ that emits green (G) light, and a blue light-emitting layer $110b_3$ that emits blue (B) light. Respective light-emitting layers $110b_1$ to $110b_3$ have different wavelength bands, and are disposed in a predetermined array, i.e., in a stripe.

An electron injection layer 150 can include an organic metal compound, and has a function to promote the injection of the electron from the cathode 12 to the light-emitting layer 110b. In this embodiment, the electron injection layer 150 is only formed between the cathode 12 and the blue light-emitting layer $110b_3$ that emits blue light among three of the red (R), green (G) and blue (B) light-emitting layers 110b. The electron injection layer 150 is formed of a lithium quinolinole complex having lithium as a center metal, and has preferably a thickness of 2 to 5 nm, and more preferably about 2 nm. The electron injection layer 150 may include materials other than the lithium quinolinole complex. Preferable examples includes a complex including a metal element group 1A of the periodic table, group 2A of the periodic table, and a rare earth element selected, for example, from Li, Na, K, Rb, Cs, Mg, Ca, Sr, Ba, La, Ce, Pr, Nd, Pm, Sm, Eu, Gd, Tb, Dy, Ho, Er, Tm, Yb and Lu. Specific examples include a sodium quinolinole complex. In the electron injection layer 150, the above-mentioned lithium quinolinole complex is produced by forming the composition ink dissolved in the liquid material described later, and discharging it to the light-emitting layer $110b_3$ using the liquid discharge method (ink jet method).

The cathode (counter electrode) 12 can be formed over an entire surface of the light-emitting element 11, and is paired with the pixel electrode 111 to flow a current through the functional layer 110. The cathode 12 can reduce a lithium (Li) ion, and is constituted by laminating a calcium layer 12a and an aluminum layer 12b in this embodiment. In this case, it is preferable that the cathode near the light-emitting layer can reduce a metal of the organic metal compound forming the electron injection layer. The calcium layer 12a preferably has a thickness of 2 to 50 nm. Preferably, the aluminum layer 12b reflects the light emitted from the light-emitting layer 110b to the substrate 2 side, and comprises an Ag film, and an Al and Ag lamination film other than an Al film. The aluminum layer 12b preferably has a thickness of 100 to 1000 nm. In this embodiment, calcium (Ca) is used for reducing the lithium ion. However, it is not limited thereto, and Mg or Al may be used.

In the blue (B) pixel area, the pixel electrode (cathode) 111, the positive hole injection/transportation layer 110a, the light-emitting layer $110b_3$, the electron injection layer 150, and the anode 12 are sequentially laminated on the substrate 2. In the red (R) or green (G) pixel area, the pixel electrode (cathode) 111, the positive hole injection/transportation layer 110a, the light-emitting layer $110b_1$ or the light-emitting layer $110b_2$, and the anode 12 are sequentially laminated on the substrate 2.

In the electroluminescence apparatus 1 having such constructions, the electron injection from the cathode 12 is promoted to emit light efficiently at the blue light-emitting layer $110b_3$ where the electron injection layer 15 is disposed at the cathode 12. On the other hand, at the red light-emitting layer $110b_1$ that emits red light or the green light-emitting layer $110b_2$ that emits green light, the calcium layer 12a of the cathode 12 is directly contacted with the light-emitting layer 110b and injects the electrons into the light-emitting layer 110b. The electroluminescence apparatus 1 in this embodiment can have similar light-emitting properties and light-emitting life as compared with those having the electron injection layer formed by using the vapor deposition method.

Referring to FIGS. 4(a) to (d), a method of producing the electroluminescence apparatus 1 will be described. The circuit element 14 including the thin film transistor, the bank 112 (the organic bank layer 112a and the inorganic bank layer 112b) and the pixel electrode 111 shown in FIG. 3 are formed on the substrate 2 in advance.

The production method in this embodiment comprises (1) a positive hole/transportation layer forming step, (2) a blue light-emitting layer forming step, (3) a electron injection layer forming step, (4) red and green light-emitting layers forming step, (5) a cathode forming step and (6) a sealing step. The production method herein described is only illustrative, and any steps may be omitted or added, as required. Either of the blue light-emitting layer forming step and the electron injection layer forming step may be preceded. In the electron injection layer forming step, the liquid discharge method is used.

Positive Hole Injection/Transportation Layer Forming Step

Figure 4A:
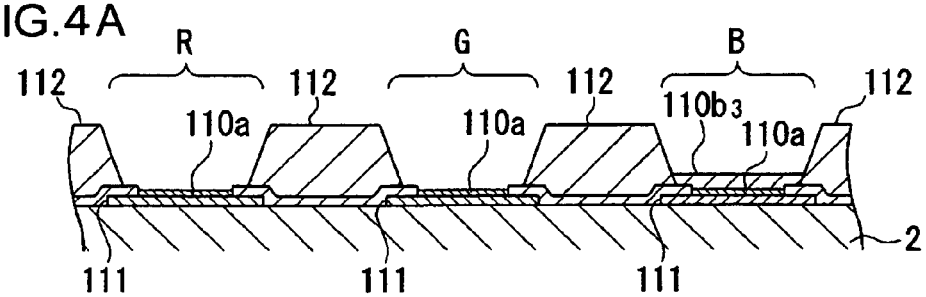
FIGS. 4(a)–(d) show a process drawing showing a method of producing an electroluminescence apparatus.

As shown in FIG. 4(a), the positive hole injection/transportation layer 110a is formed on the substrate 2 having the pixel electrode 111. In the positive hole injection/transportation layer forming step, the liquid discharge method is, for example, used to discharge a composition containing a positive hole injection/transportation layer forming material on the pixel electrode 111. Thereafter, a drying step and a heat treatment are conducted to form the positive hole injection/transportation layer 110a on the pixel electrode 111. Preferably, the positive hole injection/transportation layer forming step and subsequent steps are conducted under the atmosphere containing no water and oxygen. For example, the steps are preferably conducted under an inert gas atmosphere such as a nitrogen atmosphere and an argon atmosphere.

In the positive hole injection/transportation forming step by the liquid discharge method, the composition ink containing the positive hole/transportation layer material is filled with a discharge head (not shown) for discharging the liquid. A nozzle of the discharge head is faced to the pixel electrode 111 within an opening of the bank 112. The discharge head and the substrate 2 are moved each other so that ink drops are discharged from the discharge nozzle at a controlled liquid supply rate per drop. Thereafter, the ink drops discharged are dried to vaporize a polar solvent (liquid material). Thus, the positive hole injection/transportation layer is formed.

The composition is, for example, obtained by dissolving a mixture of a polythiophene derivative, such as polyethylene dioxythiophene (PEDOT) and a polystyrene sulfonic acid (PSS) in the polar solvent. Examples of the polar solvent include isopropyl alcohol (IPA), normal butanol, γ-butyrolactone, N-methylpyrolidone (NMP), 1,3-dimethyl-2-imidazolidinone (DMI) and a derivative thereof, and glycol ethers such as carbitol acetate and butyl carbitol acetate. Specifically, the composition is a PEDOT: PSS mixture (PEDOT/PSS=1:20): 12.52% by weight, PSS: 1.44% by weight, IPA: 10% by weight, NMP: 27.48% by weight, DMI: 50% by weight. Preferably, the composition has a viscosity of about 2 to 20 Ps, and more preferably about 4 to 15 cPs.

Blue Light-Emitting Layer Forming Step

Figure 4B:
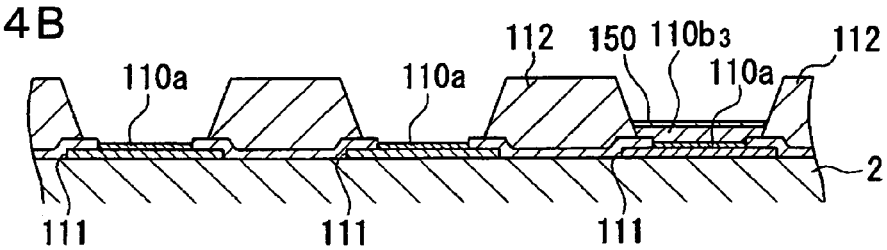

As shown in FIG. 4(b), the blue light-emitting layer 110$b_3$ is formed on a blue pixel electrode 111 on which the positive hole injection/transportation layer 110a is laminated. In other words, the composition ink containing the light-emitting layer material is discharged on the positive hole injection/transportation layer 110a. Thereafter, a drying step and a heat treatment are conducted to form the blue light-emitting layer 110$b_3$ within an opening formed on the bank 112.

In the light-emitting layer forming step, a non-polar solvent that is insoluble to the positive hole injection/transportation layer 110a is used as the solvent of the composition ink used for forming the light-emitting layer in order to prevent redissolution of the positive hole injection/transportation layer 110a. In this case, it is preferable that a surface reforming step be conducted before the light-emitting layer is formed in order to enhance wettability of the positive hole injection/transportation layer 110a to the non-polar solvent. The surface reforming step is conducted as follows: the same or a substantially same solvent as the non-polar solvent is applied on the positive hole injection/transportation layer 110a by the liquid discharge method, a spin coat method or a dipping method and is dried. Examples of the surface reforming solvent that is the same solvent as the non-polar solvent of the composition ink include cyclohexylbenzene, dihydrobenzofuran, trimethylbenzene and tetramethylbenzene. Examples of the surface reforming solvent that is the similar solvent to the non-polar solvent of the composition ink include toluene and xylene.

In the light-emitting layer forming method by the liquid discharge method, the composition ink containing the blue light-emitting layer material can be filled with the discharge head (not shown). The nozzle of the discharge head is faced to the blue positive hole injection/transportation layer 110a disposed within the opening of the bank 112. The discharge head and the substrate 2 are moved each other so that ink drops are discharged from the discharge nozzle at a controlled liquid supply rate per drop. The discharged ink drops are spread over the positive hole injection/transportation layer 110a to fill the opening within the banks 112. Then, the ink drops discharged are dried to vaporize the non-polar solvent contained in the composition ink. Thus, the blue light-emitting layer 110$b_3$ is formed.

Examples of the light-emitting material for the light-emitting layer include a fluorene-based polymer derivative, a (poly)paraphenylene vinylene derivative, a polyphenylene derivative, a polyfluorene derivative, polyvinylcarbazole, a polythiophene derivative, a perylene-based pigment, a coumarin-based pigment, a rhodamine-based pigment, other low molecular organic electroluminescence material that is soluble in the benzene derivative, and a polymer organic electroluminescence material. Specific examples include rubrene, perylene, 9,10-diphenylanthracene, tetraphenylbutadiene, Nile red, coumarin 6 and quinacridone. The non-polar solvent is preferably insoluble in the positive hole injection/transportation layer. Examples include cyclohexylbenzene, dihydrobenzofurane, trimethylbenzene and tetramethylbenzene.

Electron Injection Layer Forming Step

As shown in FIG. 4(b), the electron injection layer 150 is formed on the blue light-emitting layer 110$b_3$. As described above, the electron injection layer is for enhancing the electron injection from the cathode to the light-emitting layer, and is formed of the lithium quinolinol complex. In other words, the composition ink containing the lithium quinolinole complex dissolved in the solvent is discharged on the blue light-emitting layer 110$b_3$ using the liquid discharge method, and is then dried and heated to form the electron injection layer 150.

The solvent (liquid material) of the composition ink for use in the electron injection layer forming step is insoluble to the blue light-emitting layer 110$b_3$, has excellent wettability to the surface of the blue light-emitting layer 110$b_3$, and well dissolve the lithium quinolinole complex and the like. Specific examples include an alcohol-based solvent, such as isopropyl alcohol, a ketone-based solvent, an ether-based solvent, an ester-based solvent and an amide-based solvent.

In the electron injection layer forming step by the liquid discharge method, the composition ink containing the lithium quinolinole complex is filled with the discharge head (not shown). The nozzle of the discharge head is faced to the blue light-emitting layer 110$b_3$ within an opening of the bank 112. The discharge head and the substrate 2 are moved each other so that ink drops are discharged from the discharge nozzle at a controlled liquid supply rate per drop. The discharged ink drops are spread over the blue light-emitting layer 110$b_3$ to fill the opening within the banks 112. Then, the ink drops discharged are dried to vaporize the solvent contained in the composition ink. Thus, the electron injection layer 150 is formed.

In this production method, the lithium quinolinol complex is dissolved in isopropyl alcohol to provide the composition ink to be discharged. The blue light-emitting layer 110$b_3$ is prevented from dissolving, and excellent wettability can be provided on the surface of the blue light-emitting layer 110$b_3$. Also, the lithium quinolinole complex is dissolved uniformly in isopropyl alcohol to provide the composition ink having a uniform concentration, whereby the liquid discharge method can be easily performed. In addition, the electron injection layer 150 formed on the blue light-emitting layer 110$b_3$ can be prevented from being crystallized. The electroluminescence apparatus 1 in this embodiment can have similar light-emitting properties and light-emitting life as compared with those having the electron injection layer formed by using the vapor deposition method. By using the liquid discharge method, the electron injection layer 150 can easily be formed only between the cathode 12 and the blue light-emitting layer 110$b_3$ among three of the red (R), green (G) and blue (B) light-emitting layers 110b. Also, by using the liquid discharge method, fewer materials are used, and a desirable amount of the materials can be accurately disposed at the desired position.

Examples of the liquid discharge method include an electrification control method, a pressure vibration method, an electromechanical transducing method, an electrothermal transducing method and an electrostatic suction method. The electrification method is the one that the material is charged at an electrification electrode and a flight direction of the material is controlled at a deflecting electrode to be discharged from the nozzle. The pressure vibration method is the one that a superhigh pressure is applied to the material to be discharged to a tip of the nozzle. If a control voltage is not applied, the material proceeds straightly to be discharged from the nozzle. If a control voltage is applied, electrostatic repulsion is induced within the material, and the material splashes and is not discharged from the nozzle.

The electromechanical transducing method (piezo method) utilizes a property that a piezo element (piezoelectric element) is transduced by receiving a pulse electric signal. The piezo element is transformed to apply a pressure to a space where the material is stored via a flexible substance. The material is extruded from the space to be discharged through the nozzle. The electrothermal transducing method is the one that a heater is disposed within a space where the material is stored, and is used to rapidly vaporize the material, whereby bubbles are produced. The material within the space is discharged utilizing a pressure of the bubbles.

The electrostatic suction method is the one that a minor pressure is applied to the space where the material is stored to provide a meniscus of the material for the nozzle. Then, electrostatic attractive force is applied to take out the material. Alternatively, a method of utilizing a change in viscosity of a fluid by an electric field and a jump spark ignition method can be also used. Among the above-mentioned liquid discharge methods, the piezo method has an advantage that the composition of the material is less affected, since the material is not heated.

Red and Green Light-Emitting Layers Forming Step

Figure 4C:
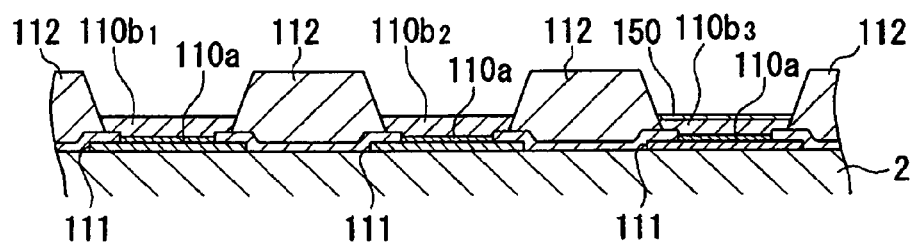

As shown in FIG. 4(c), the red light-emitting layer $110b_1$ and the green light-emitting layer $110b_2$ are formed on red (R) and green (G) pixel electrodes 111, respectively, on which the positive hole injection/transportation layer 110a is laminated. The red and green organic light-emitting layers forming step is conducted in similar procedures as described in the blue light-emitting layer forming step. In other words, by the liquid discharge method, the composition ink containing the light-emitting layer material is discharged on the positive hole injection/transportation layer 110a. Thereafter, a drying step and a heat treatment are conducted to form the light-emitting layer within an opening formed on the bank 112.

Cathode Forming Step

Figure 4D:
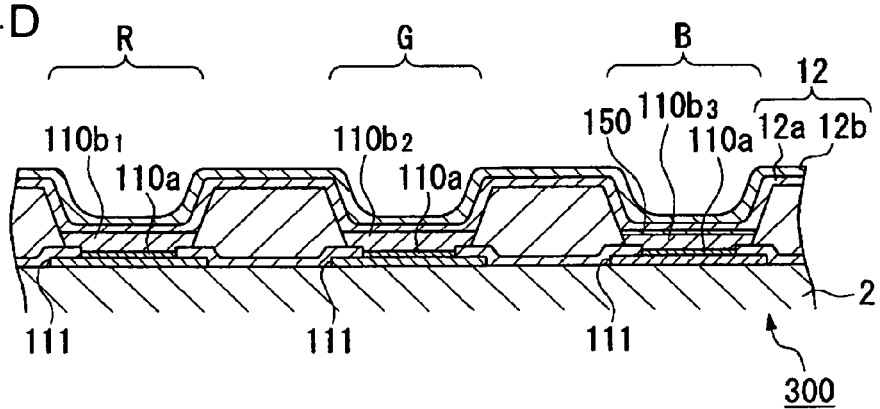

As shown in FIG. 4(d), the counter electrode (cathode) 12 which is paired with the pixel electrode (anode) 111 is formed. The cathode 12 is formed over an entire surface of the substrate 2 including the bank 112 on which the electron injection layer 150 is laminated and light-emitting layer 110b by sequentially laminating the calcium layer 12a and the aluminum layer 12b. The cathode 12 is laminated over the entire light-emitting layer 110b including the red light-emitting layer $110b_1$, the green light-emitting layer $110b_2$, and the blue light-emitting layer $110b_3$ on which the electron injection layer 150 is laminated. Thus, the light-emitting layers in red (R), green (G) and blue (B) are formed. Preferably, the cathode 12 is formed by a vapor deposition method, a sputtering method, a CVD method and the like. The vapor deposition method is particularly preferable in that the light-emitting layer 110b is prevented from being damaged by a heat. A protective layer comprising $SiO_2$, SiN or the like may be disposed for antioxidation.

Sealing Step

Finally, the substrate 2 on which the light-emitting layer (light-emitting element) is formed and the sealing substrate 3b (see FIG. 1) are sealed via the sealing resin. For example, the sealing resin comprising a thermosetting resin or an ultraviolet curing resin is applied at a peripheral of the substrate 2. The sealing substrate 3b is disposed on the sealing resin. The sealing step is preferably conducted under an inert gas atmosphere such as a nitrogen, argon or helium atmosphere. It is not preferable that the sealing step be conducted under atmosphere, since if a defect such as a pin hole is produced at the cathode 12, water, oxygen or the like may penetrate into the defect to oxidize the cathode 12.

Thereafter, the cathode 12 is connected to wiring on the substrate 2, and a driving IC (driving circuit) disposed on the substrate 2 or externally is connected to wiring on the circuit element 14 (see FIG. 1), whereby the electroluminescence apparatus 1 according to this embodiment is provided.

By the above-mentioned production method, the electron injection layer 150 is formed only on blue light-emitting layer $110b_3$ among the red (R), green (G) and blue (B) light-emitting three layers 110b. This is achieved by forming the blue light-emitting layer $110b_3$ before the electron injection layer 150 is formed and by forming the red and green light-emitting layers $110b_1$ and $110b_2$ after the electron injection layer 150 is formed.

In the above-mentioned production method, the liquid discharge method is used throughout (1) the positive hole/transportation layer forming step, (2) the blue light-emitting layer forming step, (3) the electron injection layer forming step and (4) the red and green light-emitting layers forming step. Thus, the steps can be simplified.

In this embodiment, after the electron injection layer 150 is formed on the blue light-emitting layer $110b_3$, the red and green light-emitting layers $110b_1$ and $110b_2$ are formed. However, after the blue light-emitting layer $110b_3$, the red light-emitting layer 110b and green light-emitting layers $110b_2$ are formed, the electron injection layer 150 may be formed selectively on the blue light-emitting layer $110b_3$. In this case, the similar process to that of this embodiment can be used except that an order of the formation of the red light-emitting layer $110b_1$ and the green light-emitting layer $110b_2$ and the formation of the electron injection layer 150 is different. The formation of the electron injection layer 150 is performed after the formation of the blue light-emitting layer $110b_3$, the red light-emitting layer $110b_1$ and the green light-emitting layer $110b_2$, whereby an adverse effect on the electron injection layer caused by drying and heating respective light-emitting layers can be prevented.

Now, referring to FIGS. 1 and 3, a second embodiment of the electroluminescence apparatus will be described. In the first embodiment, light emitted from the functional layer 110 is emitted from the bottom of the substrate 2 (viewer side). In contrast, in this embodiment, the light is emitted from a top of the sealing substrate 3b (view side). A difference between this embodiment and the first embodiment is mainly materials. In this embodiment, aspects different from the first embodiment will be described.

According to this embodiment, the light is emitted from the sealing substrate 3b facing to the substrate 2. Therefore, the substrate 2 may be transparent or opaque. Examples of the opaque substrate can include a metal sheet having ceramic, i.e., alumina, or stainless steel that is subjected to insulation treatment, such as surface oxidation, a thermosetting resin and a thermoplastic resin. The pixel electrode 111 is not especially limited to a transparent one, and may be any suitable materials, such as Al that functions as the anode and preferably reflects light. When the pixel electrode 111 is a transparent metal, i.e., ITO, an Al thin film is preferably formed thereunder to reflect light. A material of the cathode 12 should be transparent. Transparent metal such as ITO is used. An Al thin film may be formed between the ITO and the electron injection layer 150 such that the Al thin film has a thickness that provides transparency. Preferably, the Al thin film has a thickness of 50 nm or less for transparency. By forming the Al thin film, not only the electron injection properties of the electron injection layer 150 is promoted, but also a damage induced by plasma when the ITO is formed by sputtering can be prevented and the light-emitting layer 110b can be prevented water or oxygen from penetrating the cathode 12. The electron injection layer 150 includes the same material as that used in the first embodiment. The sealing substrate 3b includes a suitable transparent material.

In the electroluminescence apparatus having such constructions, the similar advantages to the first embodiment can be provided, and the light of the functional layer 110 can be emitted from the sealing substrate 3b.

Figure 5A:
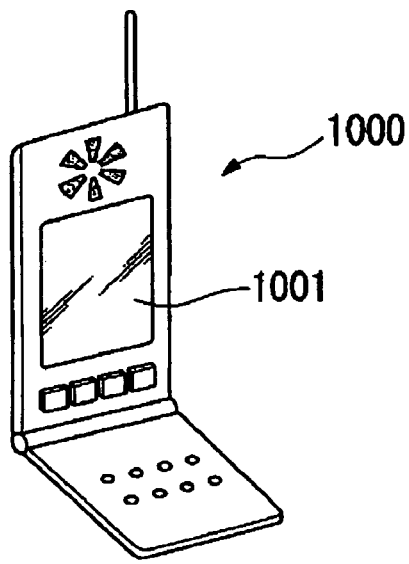
FIGS. 5(a)–(c) show illustrations showing embodiments of an electronic device according to the present invention.
Figure 5B:
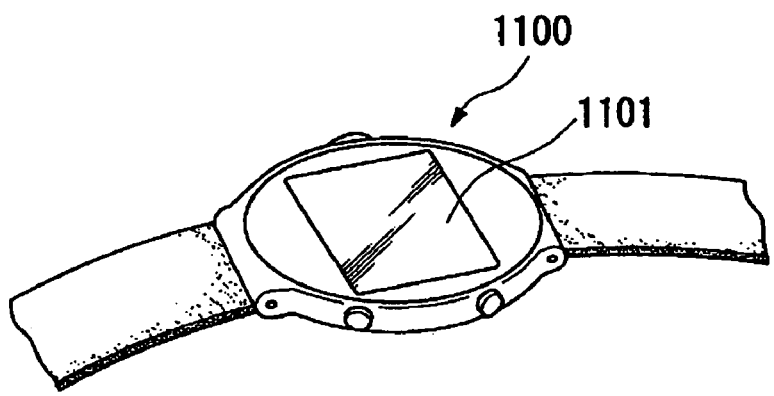
Figure 5C:
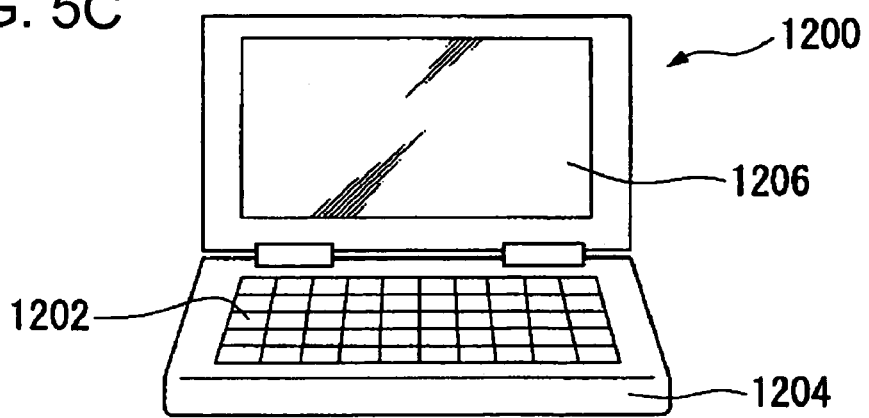

FIGS. 5(a) to (c) show embodiments of an electronic device according to the present invention. The electronic device in this embodiment comprises the above-mentioned electroluminescence apparatus according to the present invention as a display drive. FIG. 5(a) is a perspective view showing an example of a mobile phone. FIG. 5(a) shows a mobile phone body 1000 having a display 1001 using the above-mentioned display device. FIG. 5(b) is a perspective view showing an example of a watch-shaped electronic device. FIG. 5(b) shows a watch body 1100 having a display 1101 using the above-mentioned display device. FIG. 5(c) is a perspective view showing an example of information processing equipment of portable type, such as a word-processor and a personal computer. FIG. 5(c) shows an information processing device 1200 comprising an input part 1202, such as a keyboard, an information processing device body 1204 and a display 1206 using the above-mentioned display device. Respective electronic devices shown in FIGS. 5(a) to (c) include the electroluminescence apparatus of the present invention as the display, thereby providing excellent light-emitting properties and light-emitting life, and a cheap electronic device.

Although the preferable embodiments of the present invention are described above referring to the figures, the present invention should not be limited thereto. It will be apparent that any shapes or combinations of respective components cited in the embodiments described above are only example, and that many changes can be made according to the claims without departing from the spirit and the scope of the present invention.

What is claimed is:

1. A method of producing an electroluminescence apparatus, comprising
    forming a light-emitting layers that emits red light,
    forming a light-emitting layers that emits green light,
    forming a light-emitting layers that emits blue light, and
    forming a layer containing an organic metal compound to contact only the layer that emits blue light;
    where the organic metal compound contains a metal quinoline complex;
    where the organic metal compound-containing layer is not formed on the layer that emits red light; and
    where the organic metal compound-containing layer is not formed on the layer that emits green light.

2. The method of producing an electroluminescence apparatus according to claim 1, further comprising a layer capable of reducing the metal of the organic metal compound that contains at least a metal selected from the group consisting of Mg, Ca, and Al.

3. The method of producing an electroluminescence apparatus according to claim 1, wherein the layer containing the organic metal compound is formed by using a liquid material as a solvent containing one of an alcohol, a ketone, an ether, an ester, and an amide.

4. The method of producing an electroluminescence apparatus according to claim 1, wherein the light-emitting layer that emits blue light is surrounded by a bank, and the layer containing the organic metal compound is formed by injecting a liquid material on the light-emitting layer surrounded by a bank.

5. The method of producing an electroluminescence apparatus according to claim 1, wherein the organic metal compound contains at least one metal element selected from group 1A of the periodic table, group 2A of the periodic table and a rare earth element.

6. The method of producing an electroluminescence apparatus according to claim 5, wherein the metal element is selected from the group consisting of Li, Na, K, Rb, Cs, Mg, Ca, Sr, Ba, La, Ce, Pr, Nd, Pm, Sm, Eu, Gd, Tb, Dv, Ho, Er, Tm, Yb and Lu.

* * * * *